(12) United States Patent
Tannhof et al.

(10) Patent No.: US 8,988,940 B2
(45) Date of Patent: Mar. 24, 2015

(54) STRUCTURE AND METHOD FOR NARROWING VOLTAGE THRESHOLD DISTRIBUTION IN NON-VOLATILE MEMORIES

(75) Inventors: Pascal Robert Tannhof, Crolles (FR); Erwan Dornel, Crolles (FR); Davide Garetto, Crolles (FR)

(73) Assignee: International Business Machines Corporation, Armonk, NY (US)

(*) Notice: Subject to any disclaimer, the term of this patent is extended or adjusted under 35 U.S.C. 154(b) by 234 days.

(21) Appl. No.: 13/562,667

(22) Filed: Jul. 31, 2012

(65) Prior Publication Data

US 2014/0036587 A1  Feb. 6, 2014

(51) Int. Cl.
*G11C 19/08* (2006.01)
*G11C 16/04* (2006.01)
*G11C 29/02* (2006.01)
*G11C 29/44* (2006.01)

(52) U.S. Cl.
CPC .......... *G11C 29/028* (2013.01); *G11C 16/0441* (2013.01); *G11C 2029/4402* (2013.01)
USPC ............ 365/185.03; 365/185.19; 365/185.18; 365/189.09

(58) Field of Classification Search
USPC .............. 365/185.03, 185.19, 185.18, 189.09
See application file for complete search history.

(56) References Cited

U.S. PATENT DOCUMENTS

| | | | |
|---|---|---|---|
| 5,532,959 A | 7/1996 | Ninomiya et al. | |
| 5,629,892 A | 5/1997 | Tang | |
| 6,097,242 A | 8/2000 | Forbes et al. | |
| 6,148,435 A | 11/2000 | Bettman | |
| 6,577,539 B2 | 6/2003 | Iwahashi | |
| 7,535,765 B2 | 5/2009 | Maayan | |
| 7,598,731 B1 | 10/2009 | Masleid et al. | |
| 7,808,819 B2 | 10/2010 | Murin et al. | |
| 2008/0205137 A1* | 8/2008 | Yanagidaira et al. | ..... 365/185.03 |
| 2008/0294814 A1* | 11/2008 | Gorobets | ......................... 710/62 |
| 2012/0069669 A1 | 3/2012 | Sakamoto et al. | |

OTHER PUBLICATIONS

H. Aziza et al., A novel flash EEPROM diagnosis methodology based on I-V signatures extraction, 9th Annual Non-Volatile Memory Technology Symposium, NVMTS 2008, Nov. 11-14, 2008, 6 pages.

* cited by examiner

*Primary Examiner* — Richard Elms
*Assistant Examiner* — Mohammed A Bashar
(74) *Attorney, Agent, or Firm* — Howard M. Cohn; Steven Meyers

(57) ABSTRACT

Embodiments of the present invention provide a memory array of macro cells. Each macro cell comprises a storage element and a calibration element. The storage element and its corresponding calibration element are part of a common memory array within an integrated circuit, and therefore, are in close proximity to each other. The calibration element may store a parameter used to modify the threshold voltage of the storage element.

7 Claims, 11 Drawing Sheets

STRUCTURE AND METHOD FOR NARROWING VOLTAGE THRESHOLD DISTRIBUTION IN NON-VOLATILE MEMORIES

FIELD OF THE INVENTION

The present invention relates generally to memory devices, and more particularly, to non-volatile memory devices.

BACKGROUND OF THE INVENTION

Semiconductor memory has become increasingly popular for use in various electronic devices. For example, non-volatile semiconductor memory is used in computers, tablets, digital cameras, and mobile computing devices. Electrically Erasable Programmable Read Only Memory (EEPROM) and flash memory are among the most popular non-volatile semiconductor memories.

The threshold voltage Vth is an important parameter in flash operations such as programming and erasing. Variations in threshold voltage can degrade performance or even lead to data errors. It is therefore desirable to have structures and methods for reducing variation in threshold voltage for non-volatile memories.

SUMMARY OF THE INVENTION

In one embodiment of the present invention, an electronic circuit is provided. The circuit comprises a plurality of macro cells, wherein each macro cell comprises a storage element and a calibration element. The calibration element is electrically connected to the storage element. The storage element is configured and disposed to store data, and wherein the calibration element is configured and disposed to store a voltage threshold adjustment parameter for the storage element.

In another embodiment, an electronic circuit is provided. The electronic circuit comprises a plurality of flash memory cells. The plurality of flash memory cells comprises a storage flash cell and a calibration flash cell. The calibration flash cell is electrically connected to the storage flash cell. The storage flash cell and calibration flash cell comprise a macro cell. The storage flash cell is configured and disposed to store data. The calibration flash cell is configured and disposed to store a voltage threshold adjustment parameter for the storage flash cell.

In another embodiment, a method of using a macro flash cell comprising a storage flash cell and a calibration flash cell is provided. The method comprises, setting the storage flash cell to a first storage state, setting the calibration flash cell to a calibration state, setting the storage flash cell to a second storage state, and verifying a storage state of the macro flash cell.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
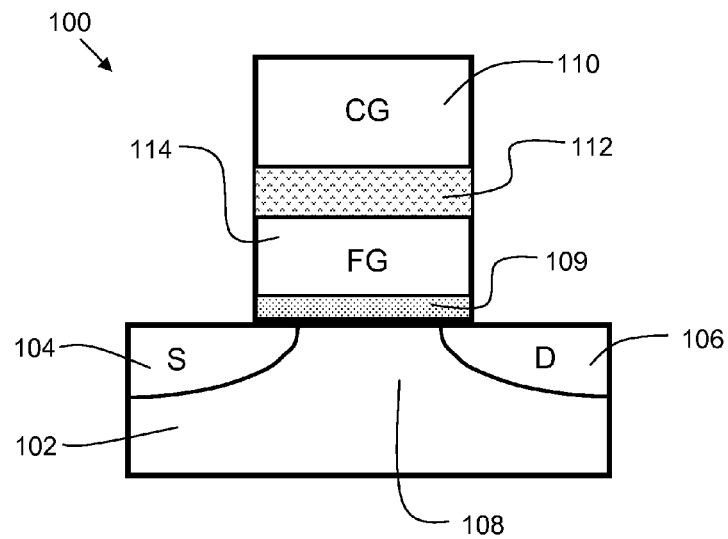

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

In some of the drawings, the terms "S" and "D" are used to indicate source and drain, respectively, of a transistor.

FIG. 1 shows a prior art flash cell.

Figure 2A:
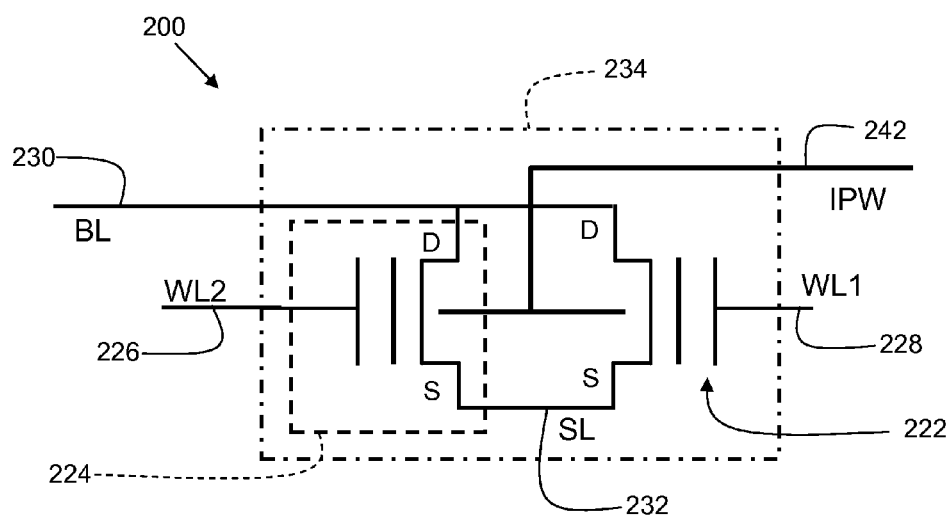

FIG. 2A shows a flash cell in accordance with an embodiment of the present invention.

Figure 2B:
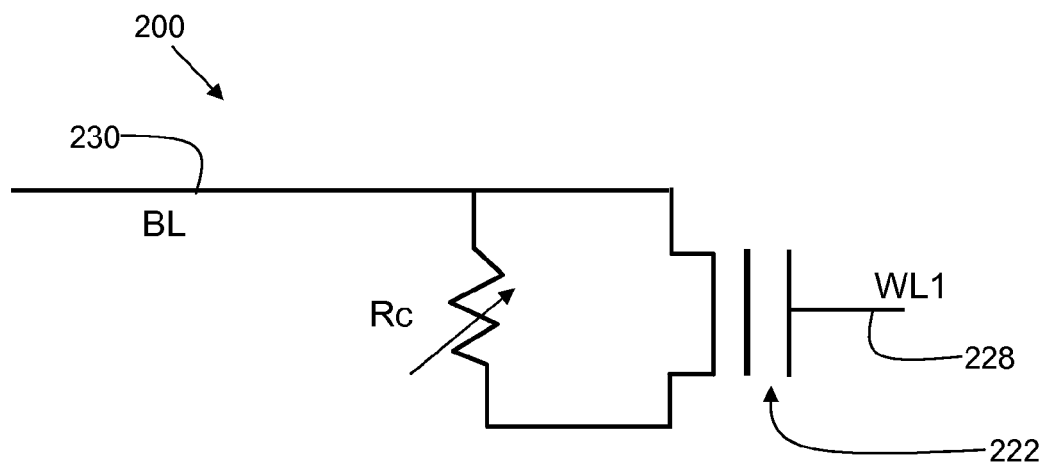

FIG. 2B shows an equivalent circuit for the embodiment shown in FIG. 2A.

Figure 3:
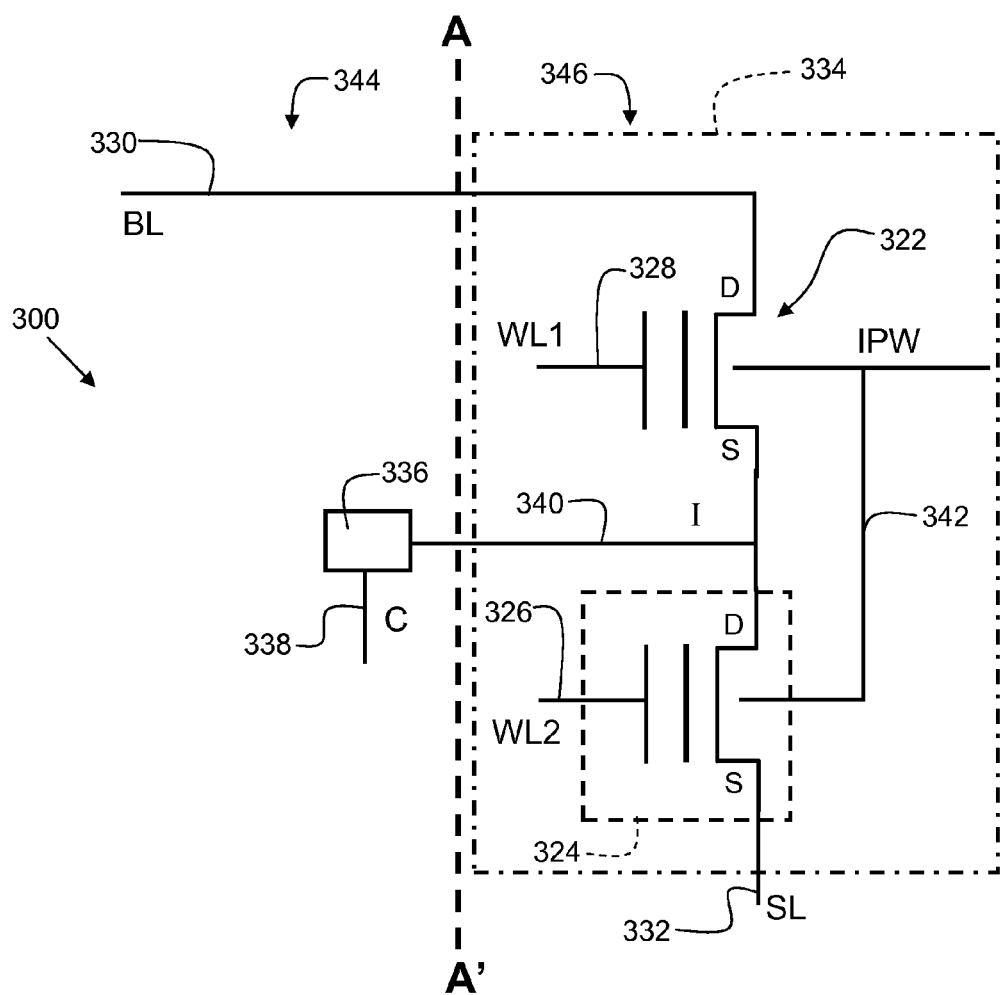

FIG. 3 shows another embodiment of the present invention.

Figure 4:
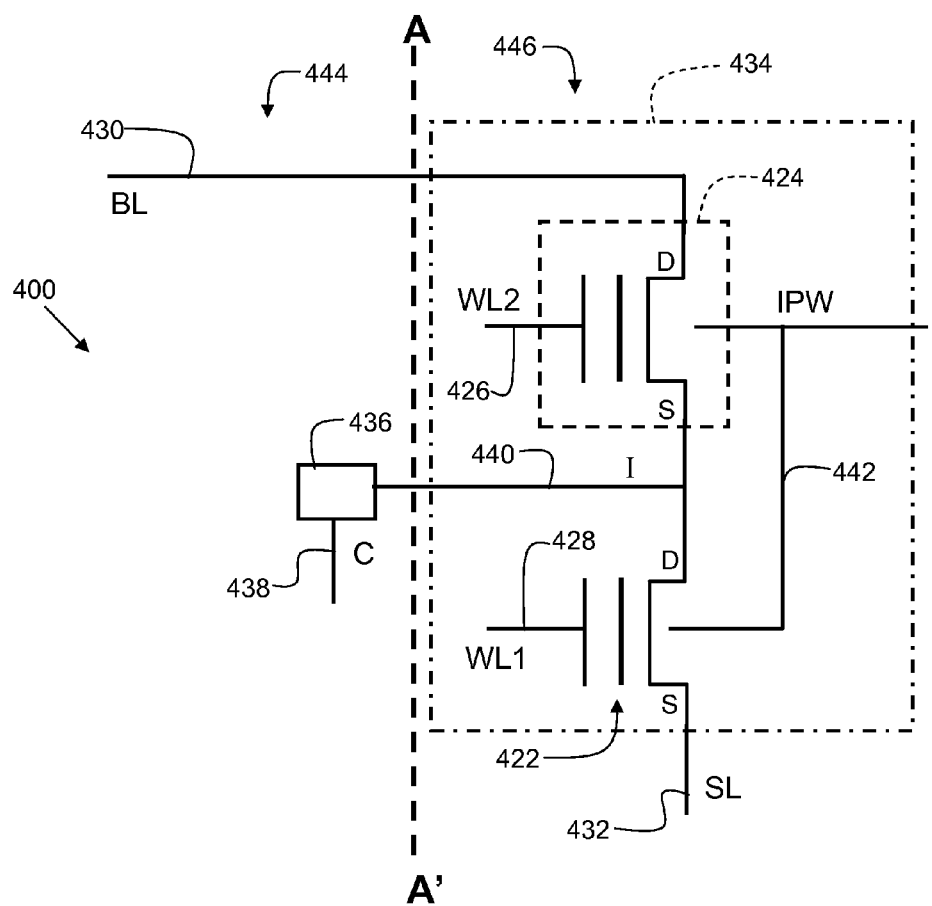

FIG. 4 shows yet another embodiment of the present invention.

Figure 5:
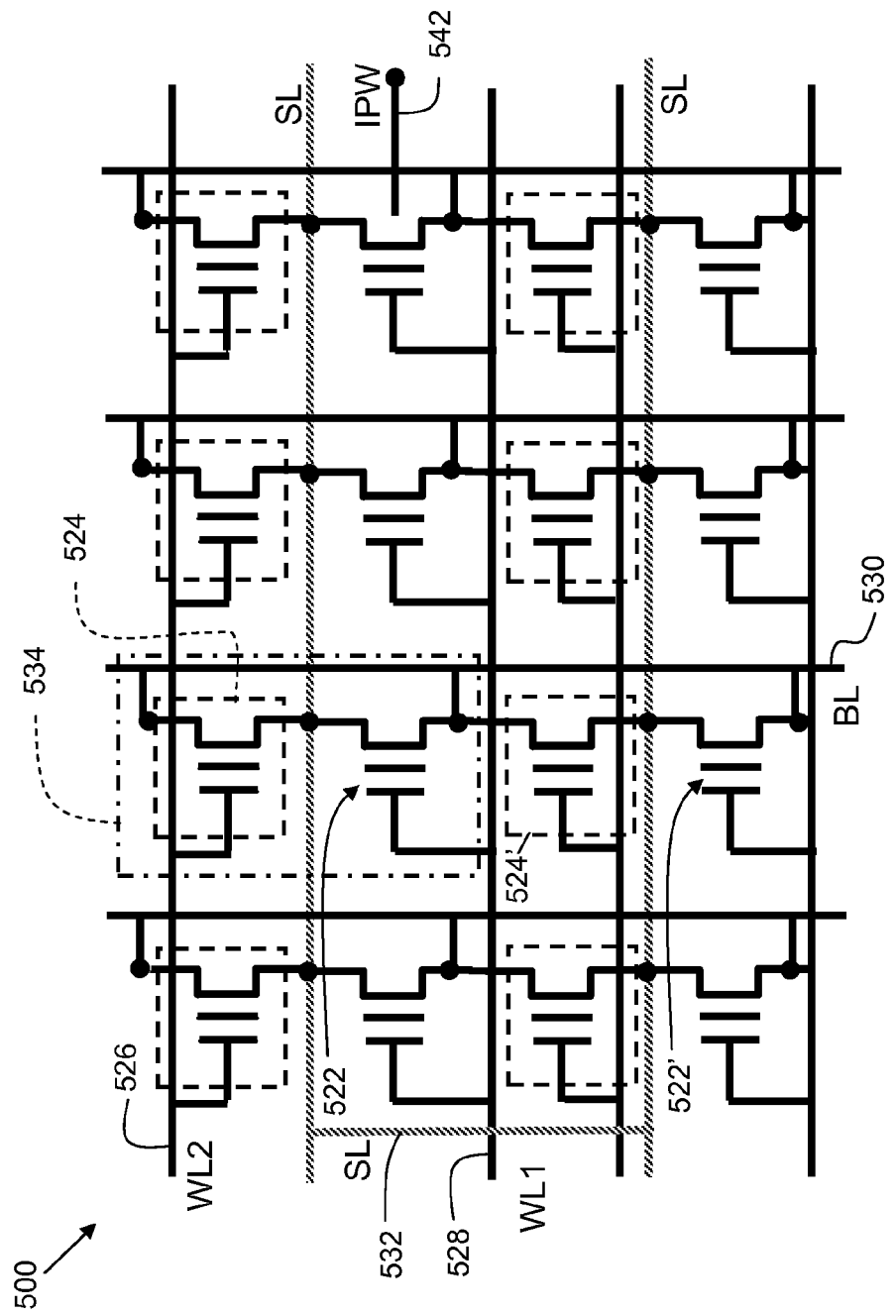

FIG. 5 shows a memory array utilizing the embodiment of FIG. 2A.

Figure 6:
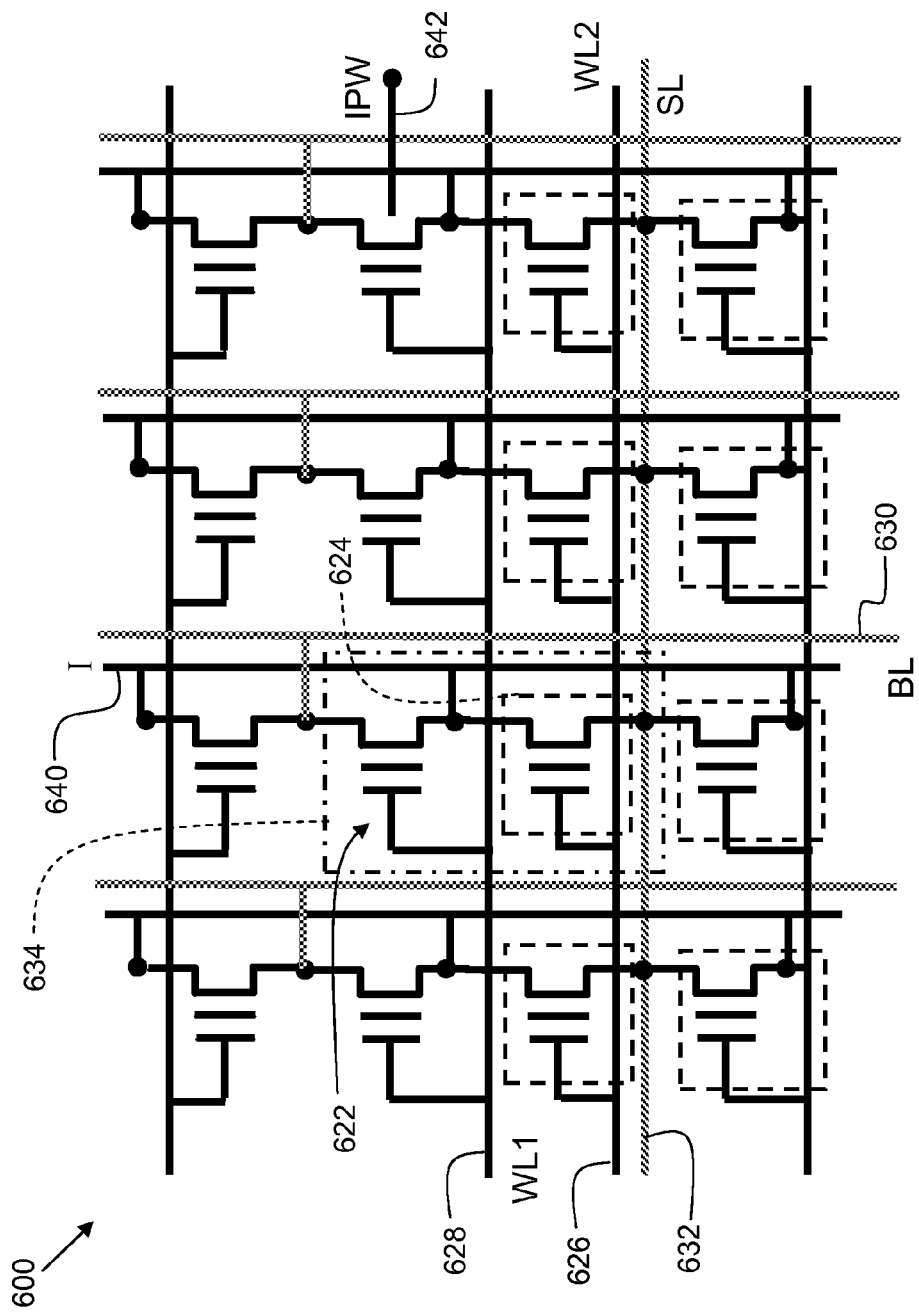

FIG. 6 shows a memory array utilizing the embodiment of FIG. 4.

Figure 7:
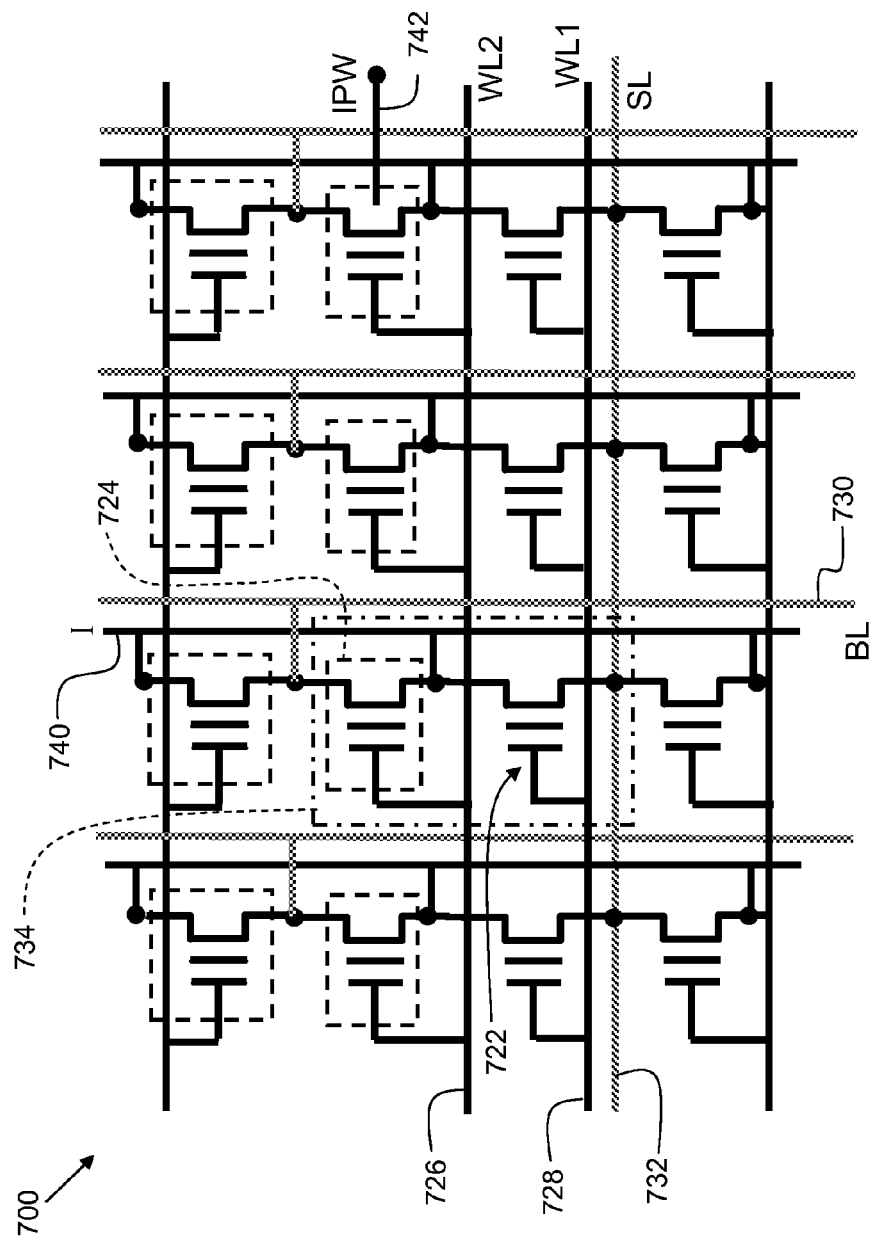

FIG. 7 shows a memory array utilizing the embodiment of FIG. 5.

Figure 8:
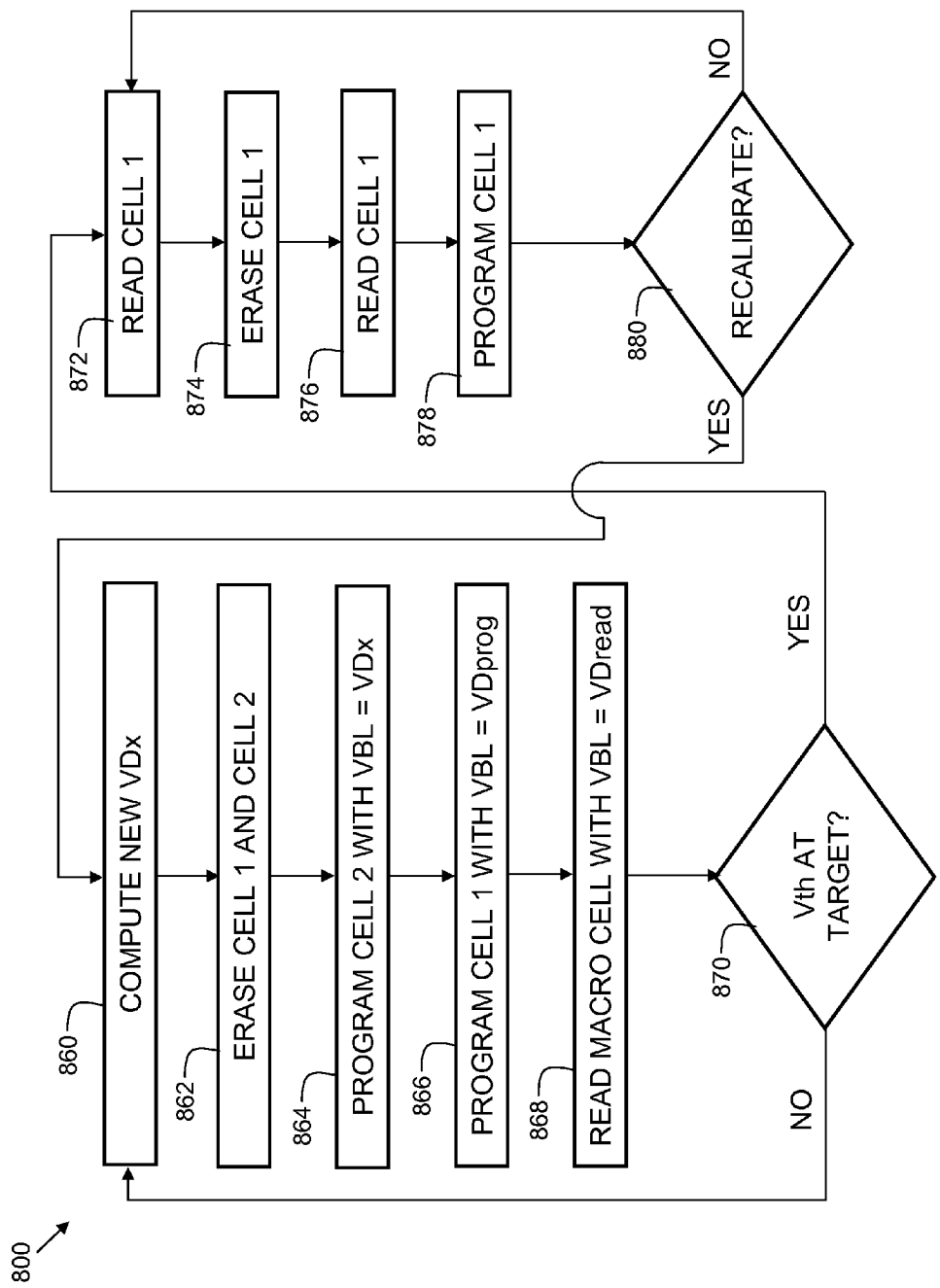

FIG. 8 is a flowchart for a method in accordance with an embodiment of the present invention.

Figure 9:
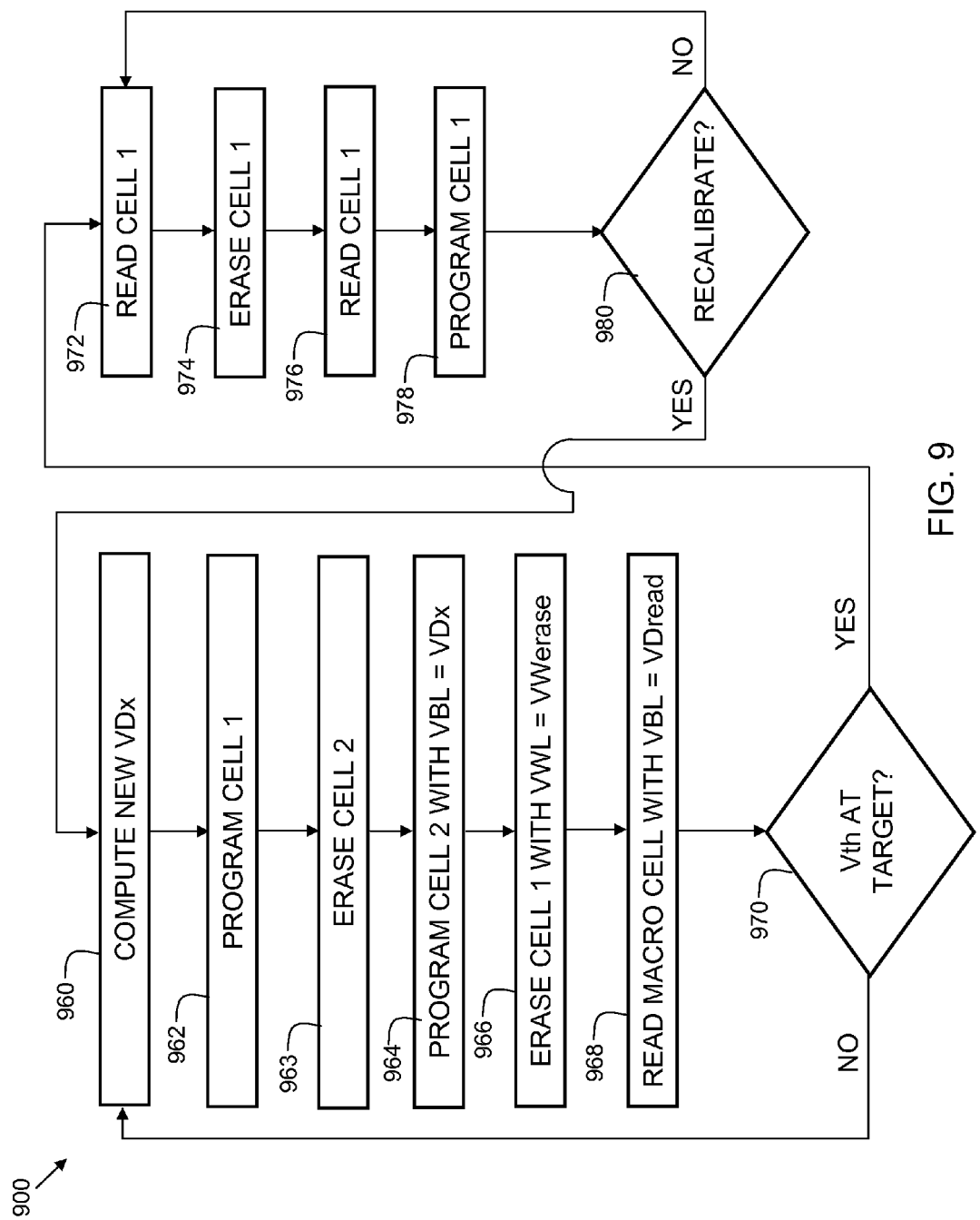

FIG. 9 is a flowchart for a method in accordance with another embodiment of the present invention.

Figure 10:
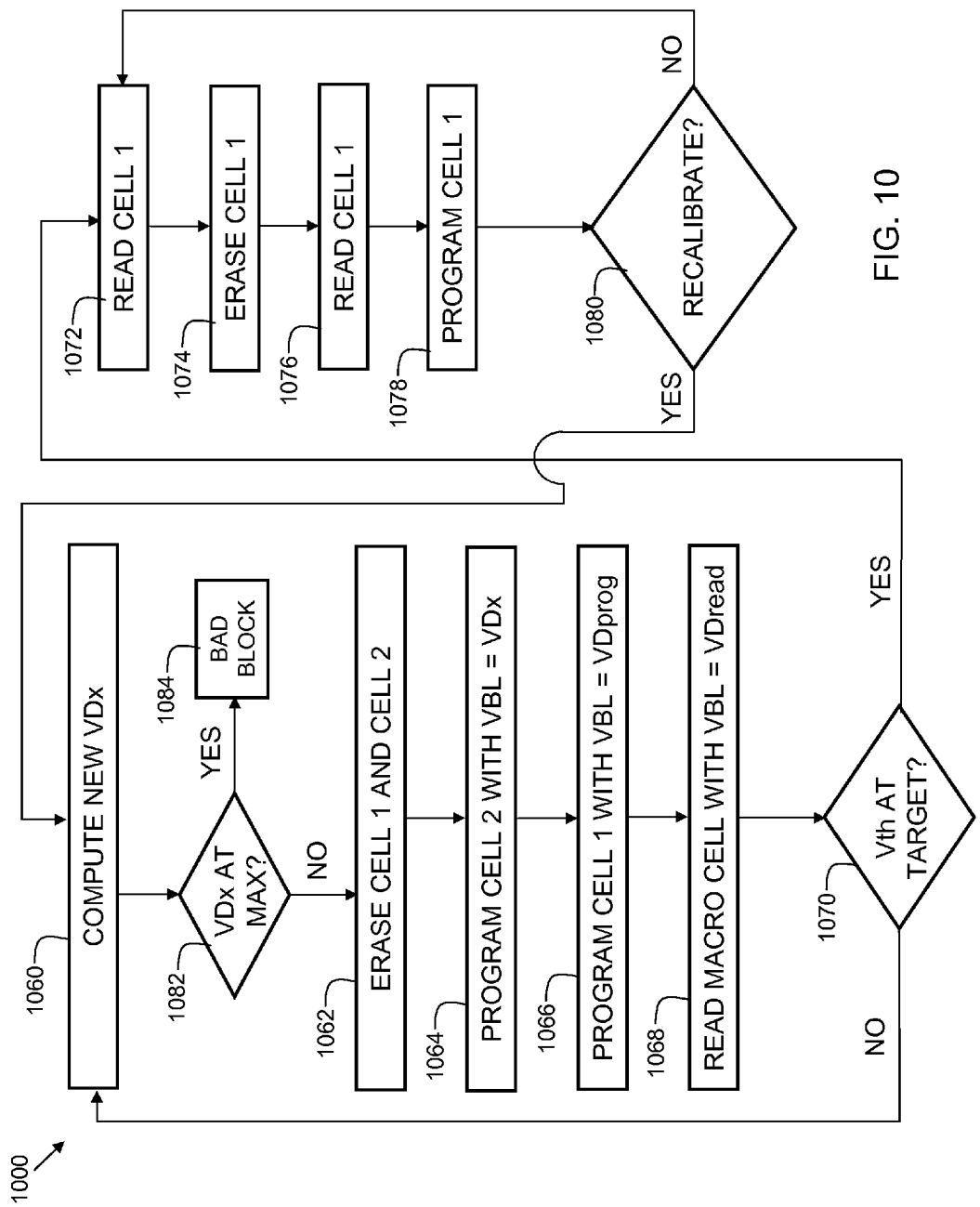

FIG. 10 is a flowchart for a method in accordance with another embodiment of the present invention.

Figure 11:
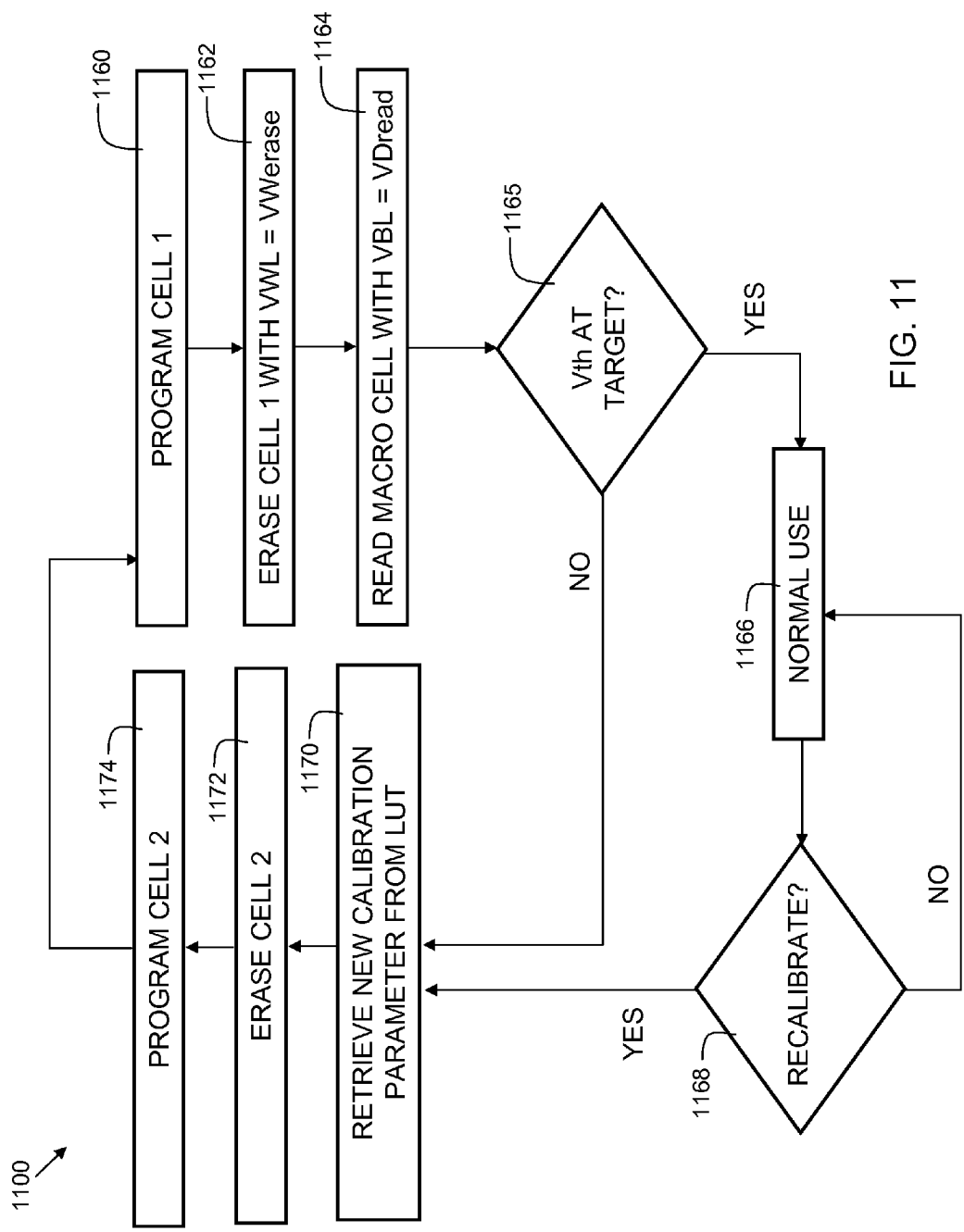

FIG. 11 is a flowchart for a method in accordance with another embodiment of the present invention utilizing a lookup table.

DETAILED DESCRIPTION OF THE INVENTION

Both the traditional EEPROM and the flash memory utilize a floating gate that is positioned above and insulated from a channel region in a semiconductor substrate. The floating gate is positioned between the source and drain regions. A control gate is provided over and insulated from the floating gate.

Some EEPROM and flash memory devices have a floating gate that is used to store two ranges of charges and therefore, the memory element can be programmed/erased between two states, e.g., an erased state and a programmed state. Such a flash memory device is sometimes referred to as a binary flash memory device because each memory element can store one bit of data. Some memory devices can store more than one bit of data per cell. Such a device is referred to as a multi-level cell (MLC).

FIG. 1 shows an example of a flash memory cell 100 as is known in the art. Flash memory cell 100 may be a CMOS transistor comprising a floating gate. Flash memory cell 100 comprises a silicon substrate 102 which comprises a source 104, a drain 106, and a body 108. A floating gate 114 is disposed above a gate dielectric layer 109 which is disposed on the substrate 102. A control gate 110 is disposed above the floating gate 114, with an insulator layer 112 disposed between the control gate 110 and the floating gate 114.

In a default, or erased state, the flash cell stores a binary "1." Programming the flash cell comprises changing the state of the flash cell such that it stores a binary "0." During programming, a high voltage (e.g. greater than 8 volts) is applied to the control gate 110, while the source 104 is set to 0 volts and the drain 106 is set to a nominal programming voltage VDprog (typically between 4 and 5 volts). This causes charge to accumulate on the floating gate 114.

During a read operation, a read voltage (less than the programming voltage, typically 5V) is applied to the control gate. The source 104 is set to 0 volts, and the drain 106 is set to a nominal read voltage VDread (typically less than 1 volt). If the floating gate 114 is charged, the contents of the flash cell are read as a binary 0. If the floating gate 114 is not charged, the contents of the flash cell are read as a binary 1.

To change the state of a flash cell from binary 0 to binary 1, the flash cell is erased. Erasing flash cell 100 causes the floating gate 114 to be discharged. This is typically accomplished by applying a large negative voltage (e.g. −8 volts) to the control gate 110. At least one node among the source 104, the drain 106 and the body 108 is held to a large positive voltage VDerase (e.g. more than 8 volts), causing discharge of the floating gate 114. If the source 104, the drain 106 and the body 108 are not held to a VDerase voltage, then those elements are held in a high-impedance state (Z). Then, the next time the flash cell 100 is read, a binary 1 is retrieved. Another way to erase the flash cell is to apply an even larger negative voltage (e.g. −16V) to the control gate 110 while the source 104, the drain 106 and the body 108 are held in to 0 volts. Hence, throughout this disclosure, setting a storage flash cell to a storage state refers to setting a storage flash cell to a particular state (e.g. a binary 1 or a binary 0). Programming a storage flash cell refers to setting the storage state of a flash cell to a non-erased state (e.g. binary 0). Erasing a storage flash cell refers to setting the storage state of a flash cell to an erased state (e.g. binary 1). The storage state is the value (e.g., 1 or 0) that is returned when the storage flash cell is read. The term "data" refers to information stored in storage flash cells.

The threshold voltage (Vth) of the flash cell 100 is controlled by the amount of charge that is retained on the floating gate. That is, the minimum amount of voltage that must be applied to the control gate before the transistor is turned on to permit conduction between its source and drain is controlled by the level of charge on the floating gate.

FIG. 2A shows a circuit 200 comprising a flash cell 234 in accordance with an embodiment of the present invention. Flash cell 234 is referred to as a "macro flash cell" and is comprised of two similar flash cells: storage flash cell 222, and calibration flash cell 224 (indicated by a dotted line box). Within this disclosure, the storage flash cell may be referred to as "cell 1" and the calibration flash cell may be referred to as "cell 2." Storage flash cell 222 and calibration flash cell 224 may each be similar in structure and operation to flash cell 100 of FIG. 1. The storage flash cell and calibration flash cell may be configured in a variety of novel ways to create various embodiments of the present invention. A "calibration state" refers to the storage state or sequence of storage states that a calibration flash cell is set to in order to calibrate the macro cell.

Circuit 200 shows storage flash cell 222 and calibration flash cell 224 in a parallel configuration. The storage flash cell 222 is electrically connected in parallel to the calibration flash cell 224. The storage flash cell 222 serves to store the data bit (e.g. either a "1" or a "0" state). The calibration flash cell is used as a variable resistor. The calibration flash cell does not store a retrieved data bit, but instead serves as a variable resistor used to affect the threshold voltage Vth of the storage flash cell 222.

FIG. 2B shows an equivalent circuit for the embodiment shown in FIG. 2A. The calibration flash cell is equivalent to variable resistance value Rc. Adjusting Rc affects the Vth for the storage flash cell 222. Performing programming and/or erase operations on the calibration flash cell 224 under certain conditions changes the resistance value Rc. Hence, the calibration flash cell is used to optimize the threshold voltage of the storage flash cell 222.

Referring back to FIG. 2A again, the bit line 230 is connected to the drain of the storage flash cell 222 and the drain of the calibration flash cell 224. A first word line signal 228 is connected to the control gate of the storage flash cell 222. A second word line signal 226 is connected to the control gate of the calibration flash cell 224. A source line 232 is shared between the source of the storage flash cell 222 and the source of the calibration flash cell 224. Circuit 200 has IPW (isolated P well) connection 242 from the body of the flash cells to additional circuitry (not shown).

Each macro flash cell comprises two flash cells such as flash cell 100 of FIG. 1. Hence, the storage density of the macro flash cell is half of the original array. However, in many applications, especially embedded applications, the amount of storage is still sufficient. The resistance Rc of the calibration flash cell 224 is established with a calibration sequence. The calibration flash cell has a minimum resistance of Rmin and a maximum resistance of Rmax. The value Rc is such that: $Rmin \leq Rc \leq Rmax$ Furthermore, Rc is a function of the voltage of the floating gate of the calibration flash cell (Vfgc): $Rc=F(Vfgc)$, and: The threshold voltage of the storage flash cell is a function of Rc: $Vth=F'(Rc)$, and therefore: $Vth=F'(F(Vfgc))$ This means that the threshold voltage of the storage flash cell is a function of the voltage of the floating gate of the calibration flash cell. The voltage of the floating gate of the calibration flash cell serves as a voltage threshold adjustment parameter for the storage flash cell. Therefore, by performing a programming operation on the calibration flash cell, the Vth of the storage flash cell may be adjusted.

For circuit 200, a calibration process may be conducted as follows:

First, an initial drain voltage VDx is chosen. In one embodiment, this is the nominal drain programming voltage (VDprog) minus 0.5 to 1 volts. In one embodiment, the nominal drain programming voltage is 4.2 volts and the initial drain voltage VDx is 3.5 volts. Next, both the storage flash cell (cell #1, 222) and the calibration flash cell (cell #2, 224) are erased by asserting a large negative voltage (e.g. −8 volts) on word line 1 (228) and word line 2 (226) with the source line 232 held in a high-impedance state and the bit line 230 set to a large positive voltage (e.g. 8 volts). In some embodiments, the storage flash cell and the calibration flash cell may be erased simultaneously.

Next, the calibration flash cell 224 is programmed by setting word line 2 (226) to a large positive voltage (e.g. +8.5 volts) with the bit line 230 set to the initial VDx value and the source line 232 set to 0 volts. Word line 1 (228) is set to 0 volts, so that the storage flash cell 222 does not get programmed during this process.

Next, the storage flash cell is programmed by setting word line 1 (228) to a high voltage (e.g. 8.5 volts) with bit line 230 set to a nominal programming voltage VDprog (e.g. 4.2 volts) and the source line 232 set to 0 volts. Word line 2 (226) is set to 0 volts, so that the calibration flash cell 224 is not affected during this process. Next, the macro flash cell 234 is read with the bit line 230 set to the nominal reading voltage VDread (e.g. 0.5) volts and the word line 1 (228) and the word line 2 (226) set to a large positive voltage (e.g. 5V). If programmed successfully, the data bit reads as a logical "0." If the storage flash cell 222 still contains a data bit of a logical "1," then the voltage threshold is not correct, and the calibration process repeats with a new value for VDx, referred to as VDxnext. VDxnext may be computed as follows: VDxnext=(Vth−Vthtarget)*alpha+VDx where Vth is a measured threshold voltage (e.g. using a differential amplifier circuit), Vthtarget is the target voltage threshold, typically specified as part of the flash cell product specifications, and alpha is a chosen iterator value (e.g. 0.05). The measured Vth is compared with a target voltage threshold. If the measured Vth is outside of a predetermined limit (e.g. outside of the range of Vth_target+/−0.5 volts), then a new drain programming voltage is established, and the calibration process repeats.

The new VDx value (VDxnext) is then used to repeat the aforementioned process until the storage flash cell 222 reflects the proper programming status, and the threshold voltage at the desired level. The calibration flash cell 224 maintains its floating gate voltage, and hence the variable resistance Rc (FIG. 2B) is set at the appropriate value to yield the desired Vth from the storage flash cell 222. VDx can range from VDx_min to VDx_max. Typically, VDx_min may be in the range of 1.0 to 1.5 volt less than VDprog, and VDx_max may be in the range of 0.5 to 1.0 volts greater than VDprog. In this embodiment, the Vth for reading the macro cell 234 is adjusted by the calibration flash cell 224.

FIG. 3 shows a circuit 300 in accordance with another embodiment of the present invention. This embodiment is referred to as BL (bit line) series configuration 1. In this embodiment, the storage flash cell 322 is electrically connected in series with the calibration flash cell 324. Control logic 336 is configured and disposed to adjust voltage levels of the I line 340. In a first state, I line 340 is set to the same voltage as the bit line 330. In a second state, the I line 340 is set to 0 volts (ground), and in the third state, the I line 340 is set to a high-impedance state (Z). This allows control of which cell is programmed and/or erased during the macro cell calibration process.

The operation of circuit 300 is similar to that of circuit 200. However, the circuit 300 has additional complexity due to the control logic 336. However, unlike the parallel configuration of circuit 200, series configurations provide the ability to adjust the Vth for the programming or erasing of the macro cell. In one embodiment, the portion of the circuit 300 on the left side of line A-A', indicated by reference 344, is embodied in a bit line decoder circuit, and the portion of the circuit 300 on the right side of line A-A', indicated by reference 346, is embodied in a non-volatile memory array.

Circuit 300 comprises storage flash cell 322 and calibration flash cell 324. Circuit 300 has IPW (isolated P well) connection 342 from the body of the flash cells to additional circuitry (not shown).

For circuit 300, a calibration process may be conducted as follows:

First, an initial drain voltage VDx is chosen. In one embodiment, this is the nominal drain programming voltage (VDprog) minus 0.5 to 1 volts. In one embodiment, the nominal drain voltage for programming (VDprog) is 4.2 volts and the initial drain voltage VDx is 3.5 volts. Next, both the storage flash cell (cell #1, 322) and the calibration flash cell (cell #2, 324) are erased by asserting a large negative voltage (e.g. −8 volts) on word line 1 (328) and word line 2 (326) with the source line 332 held in a high-impedance state and the bit line 330 set to a large positive voltage (e.g. 8 volts). The control logic 336 is configured via calibration signal C (338) such that I line 340 is set to the same voltage as bit line 330, such that the drain of both flash cells (322 and 324) receive the large positive voltage signal, as to enable the simultaneous erasure of both storage flash cell 322 and calibration flash cell 324.

Next, the calibration flash cell 324 is programmed by setting word line 2 (326) to a large positive voltage (e.g. +8.5 volts) with the bit line 330 set to the initial VDx value and the source line 332 set to 0 volts. The control logic 336 remains configured via calibration signal C (338) such that I line 340 is set to the same voltage as bit line 330. Word line 1 (328) is set to 0 volts, so that the storage flash cell 322 does not get programmed during this process.

Next, in one embodiment, the storage flash cell is programmed by setting word line 1 (328) to a high voltage (e.g. 8.5 volts) with bit line 330 set to a nominal programming voltage VDprog (e.g. 4.2 volts). Word line 2 (326) is set to 0 volts, so that the calibration flash cell 324 is not affected during this process. The control logic 336 is configured via calibration signal C (338) such that I line 340 is connected to ground, to further isolate the calibration flash cell 324 during this process. In this embodiment, the calibration cell is not used to modify the programming of the storage cell.

In another embodiment, to program the storage flash cell, word line 1 (328) is set to a high voltage (e.g. 8.5 volts) with bit line 330 set to a nominal programming voltage VDprog (e.g. 4.2 volts). The control logic 336 is configured via calibration signal C (338) such that I line 340 is in high impedance state. Word line 2 (326) is set to a high voltage (e.g. 8.5 volts). Source line (332) is set to 0 volts. In this embodiment, the calibration cell is used to modify the programming of the storage cell. In this case, the voltage at I line 340 is dependent on the state of the calibration cell, impacting the programming of the storage cell.

Next, the macro flash cell 334 is read with the bit line 330 set to the nominal reading voltage VDread (e.g. 0.5 volts). Word line 1 (328) and word line 2 (326) are set to a high voltage (e.g. 5V). The source line 322 is set to 0 volts. The control logic 336 is configured via calibration signal C (338) such that I line 340 is set to a high-impedance state (Z). If programmed successfully, the data bit reads as a logical "0." If the storage flash cell 322 still contains a data bit of a logical "1," then the voltage threshold is not correct, and the calibration process repeats with a new value for VDx, in a similar manner as described for circuit 200 of FIG. 2. In this embodiment, the calibration cell is used to modify the reading of the macro cell.

In another embodiment, to read the macro flash cell 334, the bit line 330 is set to the nominal reading voltage VDread (e.g. 0.5 volts). Word line 1 (328) is set to a high voltage (e.g. 5V). The source line 322 is set to 0 volts. Word line 2 (326) is set to 0 volts, so that the calibration flash cell 324 is not affected during this process. The control logic 336 is configured via calibration signal C (338) such that I line 340 is set to 0 volts. In this embodiment, the calibration cell is not used to modify the reading of the macro cell.

FIG. 4 shows a circuit 400 with yet another embodiment of the present invention. This embodiment is referred to as BL (bit line) series configuration 2. This embodiment is similar to circuit 300, except that the I line 440 is connected to the drain of the storage flash cell 422 instead of the calibration flash cell as with circuit 300. Hence, when programming the storage flash cell 422, in one embodiment, the control logic 436 is configured via calibration signal C (438) such that I line 440 is set to the same voltage as bit line 430, and during programming of the calibration flash cell 424, the control logic 436 is configured via calibration signal C (438) such that I line 440 is connected to ground, to further isolate the storage flash cell 422 during this process. In this embodiment, the calibration cell is further used to modify the reading of the macro cell. In this embodiment, the calibration cell is not used to modify the programming of the storage cell In another embodiment, when programming the storage flash cell 422, the control logic 436 is configured via calibration signal C (438) such that I line 440 is in a high impedance state. In this embodiment, the calibration cell is used to modify the programming of the storage cell.

In another embodiment, when reading the macro cell 434, the control logic 436 is configured via calibration signal C (438) such that I line 440 is at the same voltage as the bit line 430. In this embodiment, the calibration cell is not used to modify the reading of the macro cell 434.

In one embodiment, the portion of the circuit 400 on the left side of line A-A', indicated by reference 444, is embodied in a bit line decoder circuit, and the portion of the circuit 400 on the right side of line A-A', indicated by reference 446, is embodied in a non-volatile memory array.

In embodiments of the present invention, to erase a single macro flash cell, approximately −8V is applied to the control gate (110 of FIG. 1). At least one of the following nodes is set to approximately +8V: the bit line 430 (BL), the source line 432 (SL), the well substrate (IPW) 442. Nodes that are not set to +8 volts are "floating" at a high impedance.

For programming a flash cell, approximately +8V is applied to the control gate (110 of FIG. 1). The source line 432 (SL) is grounded. The bit line 430 (BL) is set to approximately 4.2 volts. The IPW (442) is set to ground. The control logic 436 is in the same state as during the calibration phase.

Note that the aforementioned voltages are merely examples. The voltages may vary depending on the specific flash part, and on the technology node.

FIG. 5 shows a memory array 500 utilizing the embodiment of FIG. 2A. Macro flash cell 534 is comprised of storage flash cell 522 and calibration flash cell 524. Hence, storage flash cell 522 and corresponding calibration flash cell 524 are within a common memory array. Therefore, the storage flash cell 522 and the corresponding calibration flash cell 524 are in close proximity to each other. Note that each calibration flash cell is denoted by a dotted-line box. A shared source line 532 connects the source of the calibration flash cells (the rows with cells 524 and 524') and the source of the storage flash cell (the rows with cells 522 and 522'). Word line 1 (528) is connected to the control gate of a row of storage flash cells. Word line 2 (526) is connected to the control gate of a row of corresponding calibration flash cells. The memory array 500 is connected to an IPW (isolation P well) line 542. The bit line 530 is connected to the drain of the calibration flash cells (the rows with cells 524 and 524') and the drain of the storage flash cell (the rows with cells 522 and 522').

FIG. 6 shows a memory array 600 utilizing the embodiment of FIG. 4. Macro flash cell 634 is comprised of storage flash cell 622 and calibration flash cell 624. Hence, storage flash cell 622 and corresponding calibration flash cell 624 are within a common memory array. Therefore, the storage flash cell 622 and the corresponding calibration flash cell 624 are in close proximity to each other. Note that each calibration flash cell is denoted by a dotted-line box. A source line 632 connects the sources of a row of calibration flash cells (the row with cell 624). Word line 1 (628) is connected to the control gate of a row of storage flash cells (the row with cell 622). Word line 2 (626) is connected to the control gate of a row of corresponding calibration flash cells (the row with cell 624). The memory array 600 is connected to an IPW (isolation P well) line 642. The bit line 630 is connected to the drain of storage flash cell 622. The I line 640 is connected to the drain of the calibration flash cell 624 and to the source of the storage flash cell 622.

FIG. 7 shows a memory array 700 utilizing the embodiment of FIG. 5. Macro flash cell 734 is comprised of storage flash cell 722 and calibration flash cell 724. Hence, storage flash cell 722 and corresponding calibration flash cell 724 are within a common memory array. Therefore, the storage flash cell 722 and the corresponding calibration flash cell 724 are in close proximity to each other. Note that each calibration flash cell is denoted by a dotted-line box. A source line 732 connects the sources of a row of storage flash cells (the row with cell 722). Word line 1 (728) is connected to the control gate of a row of storage flash cells (the row with cell 722). Word line 2 (726) is connected to the control gate of a row of corresponding calibration flash cells (the row with cell 724). The memory array 700 is connected to an IPW (isolation P well) line 742. The bit line 730 is connected to the drain of calibration flash cell 724. The I line 740 is connected to the drain of the storage flash cell 722 and to the source of the calibration flash cell 724.

FIG. 8 is a flowchart 800 for a method in accordance with an embodiment of the present invention for checking the programming threshold voltage. In process step 860, a new (or initial) VDx is computed. In process step 862, the storage flash cell (cell #1) and the calibration flash cell (cell #2) are erased. In process step 864, the calibration flash cell is calibrated with the bit line voltage set to the VDx computed in step 860. In process step 866 the storage flash cell is programmed with the bit line voltage set to the nominal programming voltage (VDprog). In process step 868, the macro cell is read, with the bit line voltage set to the nominal read voltage (VDread). In process step 870, a check is made to determine if the threshold voltage of the macro cell is at the desired target. If yes, the macro cell is ready for normal use (erasing, reading, and programming). Periodically, a verify operation may be performed on the macro cell to determine if recalibration is necessary in process step 880. If process step 880 indicates a successful verify operation and a proper threshold voltage, then normal operations can continue (process steps 872-878). If process step 880 indicates recalibration is necessary, then the process returns to process step 860. Note that the order and the number of the steps 872-878 shown here is for an exemplary embodiment, and that the order of some steps may be changed without departing from the scope of embodiments of the present invention.

FIG. 9 is a flowchart 900 for a method in accordance with an embodiment of the present invention for checking the erase threshold voltage. In process step 960, a new (or initial) VDx is computed. In process step 962, the storage flash cell (cell #1) is programmed. In process step 963, the calibration flash cell (cell #2) is erased. In process step 964, the calibration flash cell is calibrated with the bit line voltage set to the VDx computed in step 960.

In process step 966 the storage flash cell is erased with the word line voltage set to the nominal erasing voltage (VWerase, typically a large negative voltage, e.g. −8 volts). In process step 966 and within the series configurations, in one embodiment, the control logic 436 (see FIG. 4) is configured via calibration signal C (438) such that I line 440 is connected to bit line 430. In this embodiment, the calibration cell is further used to modify the reading of the macro cell. In process step 966 and within the series configurations, in another embodiment, the control logic 436 is configured via calibration signal C (438) such that I line 440 is set to a high-impedance state (Z). In this embodiment, the calibration cell is used to modify the erasing of the storage cell. In this case, the voltage on the I line is dependent on the state of the calibration cell, impacting the erasing of the storage cell. In that embodiment, the erasing of the storage cell is done through the node connected to the I line, keeping the other node (either the source or the drain) and the IPW in the high impedance state.

In process step 968, the macro cell is read, with the bit line voltage set to the nominal read voltage (VDread) to confirm the successful erasure. In process step 970, a check is made to determine if the threshold voltage of the macro cell is at the desired target. If yes, the macro cell is ready for normal use (erasing, reading, and programming). Periodically, a verify operation may be performed on the macro cell to determine if recalibration is necessary in process step 980. If process step 980 indicates a successful verify operation and a proper threshold voltage, then normal operations can continue (process steps 972-978). If process step 980 indicates recalibration is necessary, then the process returns to process step 960. Note that the order and the number of the steps 972-978 shown here is for an exemplary embodiment, and that the order of some steps may be changed without departing from the scope of embodiments of the present invention.

FIG. 10 is a flowchart 1000 for a method in accordance with another embodiment of the present invention for checking the programming threshold voltage. This embodiment is similar to that indicated in flowchart 800 of FIG. 8, with the addition of bad block indication, as will be described below. In process step 1060, a new (or initial) VDx is computed. In process step 1082 a check is made to see if the VDx is at its predetermined maximum allowable level. Initially it is below the maximum allowable level. However, as calibration progresses, the VDx value is gradually incremented. If, as the calibration proceeds, VDx reaches or exceeds its maximum value at process step 1082 and the Vth has not achieved its target value (step 1070), then a bad block indication is generated for the memory block containing that macro cell at process step 1084.

In general, bad blocks are blocks of flash memory that contain one or more invalid bits whose reliability is not guaranteed. Bad blocks may be present when the device is shipped, or may develop during the lifetime of the device. Bad blocks may be recorded in a bad block table, which may reside in the flash device, or be managed by an external system, such as a flash driver software module, or other flash interface.

The remaining steps are similar to those described for flowchart 800. In process step 1062, the storage flash cell (cell #1) and the calibration flash cell (cell #2) are erased. In process step 1064, the calibration flash cell is calibrated with the bit line voltage set to the VDx computed in step 1060. In process step 1066 the storage flash cell is programmed with the bit line voltage set to the nominal programming voltage (VDprog). In process step 1068, the macro cell is read, with the bit line voltage set to the nominal read voltage (VDread). In process step 1070, a check is made to determine if the threshold voltage of the macro cell is at the desired target. If yes, the macro cell is ready for normal use (erasing, reading, and programming). Periodically, a verify operation may be performed on the macro cell to determine if recalibration is necessary in process step 1080. If process step 1080 indicates a successful verify operation and a proper threshold voltage, then normal operations can continue (process steps 1072-1078). If process step 1080 indicates recalibration is necessary, then the process returns to process step 1060. Note that the order and the number of the steps 1072-1078 shown here is for an exemplary embodiment, and that the order of some steps may be changed without departing from the scope of embodiments of the present invention. Furthermore, while flowchart 1000 illustrates indicating bad blocks during a programming operation (1066), steps similar to 1082 and 1084 may also be performed during calibration of an erase threshold voltage as shown in flowchart 900 of FIG. 9.

FIG. 11 is a flowchart 1100 for a method in accordance with another embodiment of the present invention for checking the erase threshold voltage. The embodiments shown in FIGS. 8-10 are iterative methods, where the calibration parameter (in this case VDx) is changed through an iterative process until a desired threshold voltage for the macro cell is achieved. In contrast, the embodiment of FIG. 11 utilizes a look-up table (LUT) to retrieve a calibration parameter for adjusting. The LUT may be stored in a region of the memory array that contains the macro cells, or may be stored outside of the macro cell memory array.

In process step 1160, the storage flash cell (cell #1) is programmed. In process step 1162, the storage flash cell (cell #1) is erased with the word line for the storage flash cell set to a voltage of VWerase. In process step 1164, the macro cell is read with the bit line voltage set to VDread. In process step 1165, a check is made to determine if the threshold voltage within the desired range of a target threshold voltage. If yes, then the flowchart proceeds to the normal use step 1166 (which may include steps similar to the steps 1072-1078 of FIG. 10). In process step 1168, a check is made to see if recalibration is needed (e.g. based on the measured threshold voltage or verify operation). If recalibration is not needed, normal use continues in process step 1166. If recalibration is necessary, then a new calibration parameter (voltage threshold adjustment parameter) is retrieved from the look-up table (LUT) in process step 1170. The LUT may contain precomputed values that establish a relationship between a calibration parameter and a given voltage threshold. In previous examples, the calibration parameter was VDx. However, other calibration parameters are possible. Calibration parameters may include, but are not limited to, the duration for which the calibration cell is programmed (Tx), or the control gate voltage (VGx). Hence, the calibration parameter retrieved in process step 1170 may comprise a value for VDx, VGx, or Tx, or some other calibration parameter. Each of these calibration parameters may be derived iteratively (as shown in FIGS. 8-10) or via a LUT. Once the desired calibration parameter is retrieved, the calibration flash cell (cell #2) is erased in process step 1172 and programmed in process step 1174. Note that while flowchart 1100 illustrates calibration of an erase threshold voltage, a look-up table embodiment may also be utilized for calibration of a programming threshold voltage.

Some embodiments of the present invention may be used with binary, single level cells (SLC). Other embodiments of the present invention may be used with multi-level flash memory cells (MLC), where each MLC can store more than one bit of information. For example, in a MLC with four possible states per cell, two bits of information per cell can be stored. Macro cells may be comprised of an MLC for the storage flash cell. The calibration flash cell may also be an MLC. In other embodiments, the calibration flash cell may be an SLC, while the storage flash cell is an MLC.

Embodiments of the present invention provide a variety of advantages. Embodiments of the present invention provide a memory array of macro cells. Each macro cell comprises a storage element and a calibration element. The storage element and its corresponding calibration element are part of a common memory array within an integrated circuit, and therefore, are in close proximity to each other. In embodiments, the storage element and its corresponding calibration element are located between 100 nanometers and 700 nanometers of each other. The close proximity reduces calibration delays and other adverse effects such as impact by parasitic resistances and capacitances.

Another advantage of embodiments of the present invention is that once the calibration is complete, the calibration parameters are not read. Thus, the macro cell can be used in a similar manner to a conventional flash cell, in that it is read, erased, and programmed in a conventional manner. The calibration flash cell need only be accessed during the calibration process. As it does not need to be accessed during normal reading, programming, and erasing of the macro cell, access times for the macro cell are not adversely affected by the calibration flash cell. After termination of the calibration phase, the macro flash cell can be read, programmed, or erased without reading the calibration flash cell. In other embodiments, the macro cell may be recalibrated upon every programming and/or erasing operation.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electronic circuit comprising:
   a plurality of flash memory cells, wherein:
   the plurality of flash memory cells comprises a storage flash cell and a calibration flash cell;
   the calibration flash cell is electrically connected to the storage flash cell;
   the storage flash cell and calibration flash cell comprise a macro cell;
   the storage flash cell is configured and disposed to store data; and
   the calibration flash cell is configured and disposed to store a voltage threshold adjustment parameter for the storage flash cell;
   a bit line connected to a drain of the calibration flash cell;
   an I line, wherein the I line is connected to a source of the calibration flash cell and wherein the I line is connected to a drain of the storage flash cell and wherein the I line is connected to control logic, the control logic configured and disposed to adjust voltage levels of the I line; and
   a source line connected to a source of the storage flash cell.

2. The circuit of claim 1, wherein the storage flash cell comprises a multi-level flash memory cell.

3. The circuit of claim 1, wherein the storage flash cell and calibration flash cell are contained within a common memory array.

4. The circuit of claim 1, wherein the storage flash cell is electrically connected in parallel to the calibration flash cell.

5. An electronic circuit comprising:
   a plurality of flash memory cells, wherein:
   the plurality of flash memory cells comprises a storage flash cell and a calibration flash cell;
   the calibration flash cell is electrically connected to the storage flash cell;
   the storage flash cell and calibration flash cell comprise a macro cell;
   the storage flash cell is configured and disposed to store data; and
   the calibration flash cell is configured and disposed to store a voltage threshold adjustment parameter for the storage flash cell, wherein the storage flash cell is electrically connected in series to the calibration flash cell;
   a bit line connected to a drain of the storage flash cell;
   an I line, wherein the I line is connected to a source of the storage flash cell and wherein the I line is connected to a drain of the calibration flash cell and wherein the I line is connected to control logic, the control logic configured and disposed to adjust voltage levels of the I line; and
   a source line connected to a source of the calibration flash cell.

6. The circuit of claim 5, wherein the storage flash cell and calibration flash cell are contained within a common memory array.

7. The circuit of claim 5, wherein the storage flash cell comprises a multi-level flash memory cell.

* * * * *